(12) United States Patent
Österlund et al.

(10) Patent No.: US 12,304,809 B2
(45) Date of Patent: May 20, 2025

(54) BOND FORCE CONCENTRATOR

(71) Applicant: KYOCERA Technologies Oy, Espoo (FI)

(72) Inventors: Elmeri Österlund, Espoo (FI); Hannu Manninen, Espoo (FI)

(73) Assignee: KYOCERA Technologies Oy, Espoo (FI)

( * ) Notice: Subject to any disclaimer, the term of this patent is extended or adjusted under 35 U.S.C. 154(b) by 0 days.

(21) Appl. No.: 18/928,253

(22) Filed: Oct. 28, 2024

(65) Prior Publication Data

US 2025/0136438 A1 May 1, 2025

(30) Foreign Application Priority Data

Oct. 30, 2023 (FI) ...................... 20236204

(51) Int. Cl.
*B81C 1/00* (2006.01)
*B23K 20/02* (2006.01)

(52) U.S. Cl.
CPC ........ *B81C 1/00269* (2013.01); *B23K 20/023* (2013.01); *B81C 2203/0118* (2013.01)

(58) Field of Classification Search
CPC ........ B81C 1/00269; B81C 2203/0118; B23K 20/023
USPC .......................... 257/678; 438/106
See application file for complete search history.

(56) References Cited

U.S. PATENT DOCUMENTS

| | | | |
|---|---|---|---|
| 6,853,067 B1 | 2/2005 | Microassembly | |
| 7,276,789 B1 | 10/2007 | Cohn et al. | |
| 10,011,478 B2 | 7/2018 | Gudeman et al. | |
| 2006/0261476 A1 | 11/2006 | Fjelstad et al. | |
| 2007/0048898 A1 | 3/2007 | Carlson et al. | |
| 2009/0029152 A1 | 1/2009 | Yun et al. | |
| 2009/0091024 A1 | 4/2009 | Zeng et al. | |
| 2009/0186447 A1 | 7/2009 | Mastromatteo | |
| 2013/0106868 A1 | 5/2013 | Shenoy | |
| 2015/0200172 A1 | 7/2015 | Lii et al. | |
| 2015/0353349 A1 | 12/2015 | Hattass et al. | |
| 2017/0334712 A1 | 11/2017 | Gudeman et al. | |

FOREIGN PATENT DOCUMENTS

CN 109935568 * 6/2019

* cited by examiner

*Primary Examiner* — Caleen O Sullivan
(74) *Attorney, Agent, or Firm* — Espatent Oy

(57) ABSTRACT

Herein is provided a method for bonding a first substrate with a second substrate, comprising the steps of: providing a first and a second substrate, and bonding the first substrate and the second substrate together using a rectangular bond force concentrator to form a bond, wherein the first substrate or the second substrate comprises a device. Herein is further provided an apparatus comprising a first substrate and a second substrate bonded together using a rectangular bond force concentrator to form a bond. Herein is further provided a use of a bond force concentrator in bonding a first substrate and a second substrate to form a bond.

20 Claims, 3 Drawing Sheets

BOND FORCE CONCENTRATOR

TECHNICAL FIELD

The present disclosure generally relates to the field of semiconductors. The disclosure relates particularly, though not exclusively, to wafer level packaging of semiconductor substrates.

BACKGROUND

This section illustrates useful background information without admission of any technique described herein representative of the state of the art.

Bonding of substrates is a common practise in semiconductor manufacturing. In bonding, typically two substrates, a cap substrate and a device substrate, are joined to each other, closing a device inside the encapsule formed.

Bonding is typically one of the final stages of the substrate processing, prior to dicing the substrate to individual dies. In case issues occur during bonding and the encapsulation is unsuccessful, the whole preceding manufacturing process may be in vain.

SUMMARY

The appended claims define the scope of protection. Any examples and technical descriptions of apparatuses, products and/or methods in the description and/or drawings not covered by the claims are presented not as embodiments of the invention but as background art or examples useful for understanding the invention.

It is an object of certain embodiments of the present disclosure to provide high pressure to the bonding area of the substrate, or at least to provide an alternative to an existing technology. Accordingly, certain disclosed embodiments provide for an ingenious method for bonding substrates using a bond force concentrator.

According to a first example aspect of the present disclosure there is provided a method for bonding a first substrate with a second substrate, comprising the steps of:
providing a first substrate and a second substrate; and
bonding the first substrate and the second substrate together using a rectangular bond force concentrator to form a bond, wherein the first substrate or the second substrate comprises a device.

The first example aspect of the present disclosure is primarily focused on the manufacturing of semiconductor devices. Embodiments of the first example aspect provide for at least one of: increasing semiconductor device production, lowering semiconductor manufacturing costs, or increasing the resilience of the semiconductor supply chain. For example, improving the bonding of semiconductor devices ensures that fewer products need to be discarded and thus increases the production of final semiconductor devices.

In certain embodiments, the first substrate is a silicon substrate, such as a silicon wafer. In certain embodiments, the first substrate is a portion of a silicon wafer. In certain embodiments, the first substrate is a SOI (silicon-on-insulator) substrate. In certain embodiments, the first substrate comprises a silicon body.

In certain embodiments, the second substrate is a silicon substrate, such as a silicon wafer. In certain embodiments, the second substrate is a portion of a silicon wafer. In certain embodiments, the second substrate is a SOI (silicon-on-insulator) substrate. In certain embodiments, the second substrate comprises a silicon body.

In certain embodiments, the method comprises providing a rectangular bond force concentrator. In certain embodiments, the method comprises providing a rectangular bond force concentrator onto the first substrate. In certain embodiments, the method comprises providing a rectangular bond force concentrator onto the second substrate. In certain embodiments, the method comprises providing a rectangular bond force concentrator onto the first substrate and the second substrate.

In certain embodiments, the method comprises providing a plurality of rectangular bond force concentrators.

In certain embodiments, the method comprises fabricating a rectangular bond force concentrator onto the first substrate or the second substrate. In certain embodiments, the method comprises fabricating a rectangular bond force concentrator onto the first substrate or the second substrate, the first substrate or the second substrate comprising a device. In certain embodiments, the method comprises fabricating a rectangular bond force concentrator onto both the first substrate and the second substrate, the first substrate and the second substrate both comprising devices. In certain embodiments, the first substrate and the second substrate both comprise devices.

In certain embodiments, the method comprises bonding the first substrate and the second substrate together using rectangular bond force concentrators to initiate (form) a bond. In certain embodiments, the method comprises bonding the first substrate and the second substrate together using rectangular bond force concentrators to initiate the forming of the bond.

In certain embodiments, the method comprises providing (fabricating) the rectangular bond force concentrator from different material than the first substrate and the second substrate. In certain embodiments, the rectangular bond force concentrator is (fabricated) of metal. In certain embodiments, the rectangular bond force concentrator is (fabricated) of metal, such as gold. In certain preferred embodiments, the rectangular bond force concentrator is of gold. In certain embodiments, the rectangular bond force concentrator is of copper. In certain embodiments, the method comprises fabricating (providing) the rectangular bond force concentrator by evaporation. In certain embodiments, the method comprises fabricating (providing) the rectangular bond force concentrator by electroplating. In certain embodiments, the method comprises fabricating (providing) the rectangular bond force concentrator by both evaporation and electroplating.

In certain embodiments, the rectangular bond force concentrator is fabricated of semiconductor material. In certain embodiments, the rectangular bond force concentrator is fabricated of dielectric material.

In certain embodiments, the method comprises starting the fabricating of said device prior to starting the fabricating of said bond force concentrator. In certain embodiments, the method comprises finishing the fabricating of said rectangular bond force concentrator before finishing the of fabricating said device.

In certain embodiments, the rectangular bond force concentrator is fabricated simultaneously as fabricating said device. In certain embodiments, the rectangular bond force concentrator is fabricated after fabricating said device. In certain embodiments, fabricating the rectangular bond force concentrator last step prior to said bonding.

In certain embodiments, the method comprises fabricating an adhesion layer and/or a bond layer below the rectangular bond force concentrator. In certain embodiments, the method comprises fabricating an adhesion layer and/or a bond layer below the rectangular bond force concentrator to form a bonding area (frame, rail, shape, pile). In certain embodiments, the method comprises fabricating an adhesion layer and/or a bond layer below the rectangular bond force concentrator to form a bonding area (frame, rail, shape, pile) via the adhesion layer and/or the bond layer.

In certain embodiments, the method comprises forming a bonding area via the layer(s) fabricated on top of the first substrate or the second substrate. In certain embodiments, the method comprises forming the bonding area via the adhesion layer and/or the bond layer fabricated on top of the first substrate or the second substrate.

In certain embodiments, the bonding area (sealing ring, sealing rail, sealing circle, frame) is formed of the adhesion layer and/or the bond layer provided onto the substrate. In certain embodiments, the rectangular bond force concentrator is provided onto the bonding area (the adhesion layer and/or the bond layer). In certain embodiments, the rectangular bond force concentrator is a separate entity on top of the bonding area (the adhesion layer and/or the bond layer).

In certain embodiments, the rectangular bond force concentrator is a narrow part (entity) on top of the bonding area. In certain embodiments, the rectangular bond force concentrator is a narrower part (entity) on top of the bonding area, in comparison to the bonding area. In certain embodiments, the rectangular bond force concentrator is a raised feature on top of the bonding area (the adhesion layer and/or the bond layer). In certain embodiments, the rectangular bond force concentrator is a rectangular-shaped (cube-like) raised feature on top of the bonding area.

In certain embodiments, the rectangular bond force concentrator is narrower in comparison to the bonding area (the adhesion layer and/or the bond layer) (when observed from the side). In certain embodiments, the rectangular bond force concentrator is smaller in area in comparison to the bonding area (the adhesion layer and/or the bond layer) (when observed from above).

In certain embodiments, the bonding area is configured to receive the opposing bonding area of the opposing (other) substrate upon bonding. In certain embodiments, the bonding areas of the substrates contact upon bonding.

In certain embodiments, the method comprises fabricating an adhesion layer and/or a bond layer below the rectangular bond force concentrator of the first substrate. In certain embodiments, the method comprises fabricating an adhesion layer and/or a bond layer on the first substrate.

In certain embodiments, the method comprises fabricating an adhesion layer and/or a bond layer below the rectangular bond force concentrator of the second substrate. In certain embodiments, the method comprises fabricating an adhesion layer and/or a bond layer on the second substrate.

In certain embodiments, the rectangular bond force concentrator is (resides) on the bond layer. In certain embodiments, the rectangular bond force concentrator is provided on a bond layer. In certain embodiments, the bond force concentrator is on top of the bond layer. In certain embodiments, the bond force concentrator is fabricated (is applied) on the bond layer. In certain embodiments, the bond force concentrator is fabricated on top of the bond layer. In certain embodiments, the bond force concentrator is the topmost feature on the substrate (on top of all the other layer(s)). In certain embodiments, the rectangular bond force concentrator is a topmost raised feature on the top of the layer(s) on the first substrate or the second substrate.

In certain embodiments, the bond force concentrator provided onto the bonding area enables keeping the pressure of the bonding constant. In certain embodiments, the bond force concentrator provided onto the bonding area enables providing a high pressure at the beginning of the bonding, and then reducing the pressure of the bonding as the bond force concentrator merges with the opposing layer(s).

In certain embodiments, during bonding the bond force concentrator merges with the opposing material layer(s) (the bond layer(s) of the first substrate and the second substrate). In certain embodiments, during bonding the bond force concentrator protrudes into the opposing material layer(s), and loses its shape. In certain embodiments, during bonding the bond force concentrator deforms (and loses its original shape) into the opposing material layer(s). In certain embodiments, during bonding the bond force concentrator penetrates into the opposing material layer(s), and loses its original (rectangular) shape during said bonding. In certain embodiments, during bonding the bond force concentrator penetrates into the bond layer(s) of the first and/or the second substrate and loses its original (rectangular) shape during said bonding.

In certain embodiments, the first substrate comprises a bond layer, and the second substrate comprises another bond layer, wherein the first substrate or second substrate comprises the rectangular bond force concentrator on (top of, provided onto) the bond layer. In certain embodiments, the rectangular bond force concentrator merges with the bond layers of the first substrate and the second substrate during said bonding to form the bond.

In certain embodiments, at least the first substrate comprises a device. In certain embodiments, the second substrate comprises a device. In certain embodiments, the first substrate comprises a plurality of devices. In certain embodiments, the second substrate comprises a plurality of devices.

In certain embodiments, the device is a semiconductor device. In certain embodiments, the device is a microelectromechanical systems, MEMS, device. In certain embodiments, the device is a resonator. In certain embodiments, the resonator is a microelectromechanical systems, MEMS, resonator. In certain embodiments, the resonator is a beam resonator. In certain embodiments, the resonator is a stacked beam resonator. In certain embodiments, the stacked beam resonator comprises a plurality of beam elements and connection elements, where the plurality of beam elements are positioned adjacent to each other and adjacent beam elements are mechanically connected to each other by the connection elements.

In certain embodiments, the device is adapted to resonate in an in-plane resonance mode. In certain embodiments, the device is adapted to resonate in a length extensional resonance mode. In certain embodiments, the device is adapted to resonate in an in-plane length extensional resonance mode. In certain embodiments, the device is adapted to resonate in a Lamb wave resonance mode. In certain embodiments, the device is adapted to resonate in a contour resonance mode.

In certain embodiments, the method comprises fabricating a rectangular bond force concentrator that encircles the device. In certain embodiments, the rectangular bond force concentrator encircles (surrounds, goes around) the device.

In certain embodiments, the first substrate and the second substrate are bonded together to form a bond. In certain embodiments, the first substrate and the second substrate are bonded together to form a chip (or after dicing, a die).

In certain embodiments, the bonding comprises thermocompression bonding. In certain alternative embodiments, the bonding comprises eutectic bonding, or flip chip bonding. In certain alternative embodiments, the bonding comprises glass frit bonding, anodic bonding or adhesive bonding. In certain alternative embodiments, the bonding comprises solid-liquid interdiffusion bonding (SLID) or transient liquid phase bonding (TLP).

In certain embodiments, said bonding comprises (essentially) two stages. In certain embodiments, said stages comprise different level of pressure. In certain embodiments, said bonding comprises a first stage comprising high pressure (provided via the bond force concentrator), and a second stage comprising low pressure. In certain embodiments, the first stage comprises pressure of 10-200 MPa. In certain embodiments, the second stage comprises pressure of 1-20 MPa.

In certain embodiments, the method comprises keeping applied force during said bonding (essentially) constant. In certain embodiments, the second stage comprises keeping applied force constant. In certain embodiments, the method comprises deforming said bond force concentrator and increasing contact area. In certain embodiments, the method comprises decreasing the pressure during said bonding due to increased contact area.

In certain embodiments, said bonding comprises the first stage, in which high pressure is provided via the bond force concentrator, and the second stage, in which said bonding is completed via low pressure.

In certain embodiments, the rectangular bond force concentrator is brought to contact with another substrate (the first substrate or the second substrate, the opposite substrate, the other substrate used in bonding) to form the bond. In certain embodiments, the rectangular bond force concentrator is brought to contact with the bonding area of another substrate to form the bond. In certain embodiments, the rectangular bond force concentrator receives the first substrate or the second substrate in said bonding. In certain embodiments, the rectangular bond force concentrator enables forming a bond, when brought to contact with the first substrate or the second substrate. In certain embodiments, the rectangular bond force concentrator penetrates (protrudes) into the first substrate or the second substrate or into the layer(s) fabricated on top of the first substrate or the second substrate.

In certain embodiments, the rectangular bond force concentrator is a raised feature (peak, peak-like item) on the top surface of the first substrate or the second substrate. In certain embodiments, the rectangular bond force concentrator is a raised feature that forms the highest feature on the top surface of the first substrate or the second substrate. In certain embodiments, the rectangular bond force concentrator forms a receiving shape, which receiving shape is brought to contact with another substrate (the first substrate or the second substrate, the opposite substrate, the other substrate used in bonding) to initiate the forming of the bond. In certain embodiments, the rectangular bond force concentrator forms a receiving shape, which receiving shape is brought to contact with another substrate to form the bond. In certain embodiments, the receiving shape is rectangular (angular).

In certain embodiments, the rectangular bond force concentrator has a cross-sectional shape of a rectangle. In certain embodiments, the bond force concentrator is cross-sectionally rectangular. In certain embodiments, the bond force concentrator comprises right angles.

In certain embodiments, the rectangular bond force concentrator is narrower (smaller) than the bonding area. In certain embodiments, the rectangular bond force concentrator is cross-sectionally narrower than the bonding area. In certain embodiments, the bond force concentrator is narrower (smaller) than the bonding area that is contacted with the first substrate or second substrate (another substrate, the opposite substrate, the other substrate used in bonding) to form the bond. In certain embodiments, the bond force concentrator is (cross-sectionally) narrower than the bonding frame (rail) formed by the adhesion layer and/or the bond layer. In certain embodiments, the bonding area (frame) encircles the device.

In certain embodiments, said bonding comprises deforming the rectangular bond force concentrator to form the bond. In certain embodiments, the rectangular bond force concentrator loses its original rectangular shape during said bonding. In certain embodiments, the rectangular bond force concentrator merges with the opposing material layers (the material layers of the other substrate to be bonded) during said bonding to form a bond. In certain embodiments, the rectangular bond force concentrator merges with the bond layers of the first substrate and the second substrate during said bonding to form a bond.

According to a second example aspect of the invention there is provided an apparatus (chip, die) obtained (manufactured) via the method according the first aspect, comprising a first substrate and a second substrate bonded together using a rectangular bond force concentrator to form a bond, wherein the first substrate comprises the rectangular bond force concentrator and/or a device.

In certain embodiments, said bond is formed by causing the rectangular bond force concentrator to penetrate (protrude, merge) into the second substrate. In certain embodiments, the apparatus comprises the rectangular bond force concentrator penetrated into the opposing layer(s) of first substrate or the second substrate.

In certain embodiments, the apparatus comprises the rectangular bond force concentrator penetrated into the first substrate or the second substrate (the opposing substrate of the bonding).

In certain embodiments, the first substrate comprises a device. In certain embodiments, the second substrate comprises a device. In certain embodiments, both the first substrate and the second substrate comprise devices. In certain embodiments, the apparatus formed by bonding the first and the second substrate is a dual device chip (die).

In certain embodiments, the first substrate comprises a bond force concentrator. In certain embodiments, the second substrate comprises a bond force concentrator. In certain embodiments, the first substrate and the second substrate comprise bond force concentrators. In certain embodiments, the first substrate and the second substrate are bonded together using rectangular bond force concentrators to form bond(s). In certain embodiments, the rectangular bond force concentrator encircles the device.

In certain embodiments, the apparatus comprises an adhesion layer and/or a bond layer below the rectangular bond force concentrator. In certain embodiments, the apparatus comprises an adhesion layer and/or a bond layer below the rectangular bond force concentrator that is configured as a bonding area (frame, rail, shape, pile). In certain embodiments, said bonding area is formed via the layer(s) fabricated on top of the first substrate or the second substrate (via the adhesion layer and/or the bond layer fabricated on top of the first substrate or the second substrate). In certain embodiments, the bonding area is configured to receive the opposing bonding area of the opposing (another) substrate upon bonding. In certain embodiments, the bonding areas of the opposing substrates are configured to contact upon bonding. In certain embodiments, the bonding area concentrator encircles the device.

According to a third example aspect of the invention there is provided a use of a bond force concentrator in bonding a first substrate and a second substrate to form a bond according to the method of the first aspect or to form an apparatus according to the second aspect.

In accordance with certain embodiments, embodiments of any of the second aspect and the third aspect are provided, the embodiments comprising subject matter of any single embodiment presented in connection with the first aspect, or the embodiments comprising subject matter of any of the embodiments presented in connection with the first aspect combined with subject matter presented in any other embodiment or embodiments.

Different non-binding example aspects and embodiments have been illustrated in the foregoing. The embodiments in the foregoing are used merely to explain selected aspects or steps that may be utilized in different implementations. Some embodiments may be presented only with reference to certain example aspects. It should be appreciated that corresponding embodiments may apply to other example aspects as well. In particular, the embodiments described in the context of the first aspect are applicable to each further aspect. Any appropriate combinations of the embodiments may be formed.

BRIEF DESCRIPTION OF THE FIGURES

Some example embodiments will be described with reference to the accompanying figures, in which.

DETAILED DESCRIPTION

In the following description, like reference signs denote like elements or steps.

As used herein, the terms chip or package mean an entity of two substrates bonded together comprising at least one device. In the context of the present disclosure, the terms chip or package are understood to mean the bonded entity comprising a device prior to dicing the entities as individual dies. Upon dicing the chip, individual dies are formed. In dicing, the dies are separated from each other using a special equipment. In the context of the instant disclosure, the terms chip and die are used for the bonded apparatus that comprises at least one device.

As used herein, the term a device refers to any kind of apparatus or device that may appear in a semiconductor industry, such as circuitry, microchip, microprocessor, computer chip, resonator, sensor, accelerometer, gyroscope, actuator, and process-control unit, or alike.

In certain embodiments, the device has been packaged. In certain embodiments, the device is a semiconductor device. In certain embodiments, the device is a MEMS device.

As used herein, the term rectangular refers to a shape with four straight sides and four right angles. As used herein, the term rectangle may refer to a shape comprising unequal lengths of adjacent sides. As used herein, the term rectangular also includes a square. As used herein, the term rectangular is used to define the bond force concentrator. In certain embodiments, the rectangular bond force concentrator has a cross-sectional shape of a rectangle. In certain embodiments, the bond force concentrator is cross-sectionally rectangular. In certain embodiments, the bond force concentrator comprises right angles. In certain embodiments, the bond force concentrator has a general (three-dimensional, 3D) shape of a cuboid (rectangular cuboid, a rectangular parallelepiped, a rectangular box).

Figure 1A:
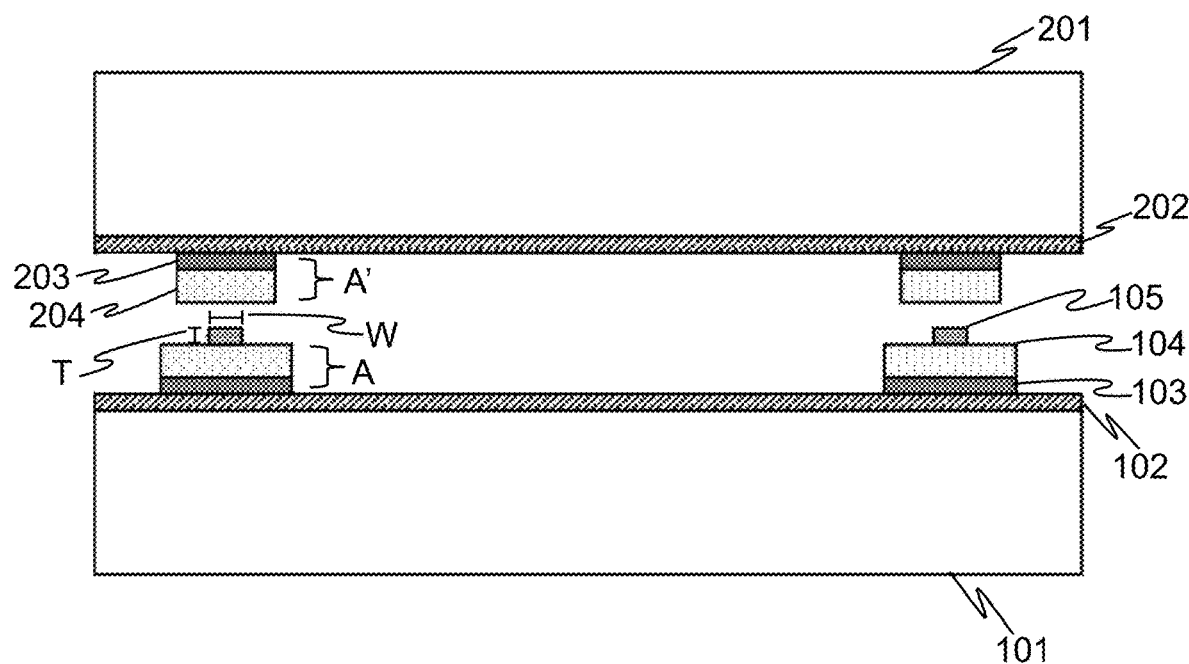
FIG. 1a schematically shows a first substrate comprising a bond force concentrator and a second substrate according to certain example embodiments.

FIG. 1a shows a first substrate 101 comprising a rectangular (angular) bond force concentrator 105 and a second substrate 201 according to certain example embodiments. In certain embodiments, the first substrate 101 and the second substrate 201 are silicon substrates, such as silicon wafers. In certain embodiments, the first substrate 101 comprises an insulation layer 102. In certain embodiments, the second substrate comprises an insulation layer 202. In certain embodiments, the second substrate comprises a rectangular bond force concentrator and/or a device (not shown).

According to the present disclosure, herein is provided a method for bonding a first substrate 101 with a second substrate 201, comprising the steps of providing a first substrate 101 and a second substrate 201, and bonding the first substrate 101 and the second substrate 201 together using a rectangular bond force concentrator 105 to form a bond, wherein the first substrate 101 or the second substrate 201 comprises a device. In certain embodiments, the method further comprises fabricating a rectangular bond force concentrator 105 onto the first substrate 101 or to the second substrate 201, the first substrate 101 or the second substrate 201 (or both substrates 101, 201) comprising a device.

In certain embodiments, the rectangular bond force concentrator 105 is a raised feature on the top (uppermost) surface of the first substrate 101 or the second substrate 201. In certain embodiments, the rectangular bond force concentrator 105 comprises edges (surfaces, faces) that meet at right angles. In certain embodiments, the rectangular bond force concentrator 105 comprises edges (surfaces, faces) shaped as rectangles. In certain embodiments, the rectangular bond force concentrator has a general shape of a cuboid.

In certain embodiments, the present disclosure comprises fabricating the rectangular bond force concentrator 105 by evaporation. In certain embodiments, no sputtering is needed. In certain embodiments, the rectangular bond force concentrator 105 is fabricated from different material than the first substrate 101 and the second substrate 201. In certain embodiments, the rectangular bond force concentrator 105 is (fabricated) of metal, such as gold.

In certain embodiments, the present disclosure comprises fabricating an adhesion layer 103 onto the first substrate 101 below the rectangular bond force concentrator 105. In certain embodiments, the adhesion layer 103 is of an alloy, comprising metals such as tungsten or platinum. In certain embodiments, the adhesion layer 103 acts as a diffusion barrier and as an adhesive in between the adjacent layers.

In certain embodiments, the present disclosure comprises fabricating a bond layer 104 onto the first substrate 101 below the rectangular bond force concentrator 105. In certain embodiments, the bond layer 104 is an additional layer of same material as the rectangular bond force concentrator 105. In certain embodiments, the bond layer 104 is of gold.

In certain embodiments, the present disclosure further comprises fabricating an adhesion layer 203 and/or a bond layer 204 onto the second substrate. In certain embodiments, the adhesion layer 203 is of an alloy, comprising metals such as tungsten or platinum. In certain embodiments, the bond layer 204 is of gold.

In certain embodiments, the adhesion layer 103, 203 and/or the bond layer 104, 204 below the rectangular bond force concentrator 105 form a bonding area A, A'. In certain embodiments, the bonding area A, A' is configured to receive the opposing bonding area A, A' of the opposing substrate 101, 201 upon bonding. In certain embodiments, the bonding area A, A' is in a form of a pile (of layers). In certain embodiments, the bonding area A, A' is rectangular. In certain embodiments, bonding area A, A' comprises edges (surfaces, faces) that meet at right angles. In certain embodiments, the bonding area A, A' comprises edges (surfaces, faces) shaped as rectangles. In certain embodiments, the bond force concentrator 105 is narrower than the bonding area A, A'. In certain embodiments, the bond force concentrator has a width W of less than 5 μm. In certain embodiments, the bond force concentrator has a thickness T of less than 80 nm.

Figure 1B:
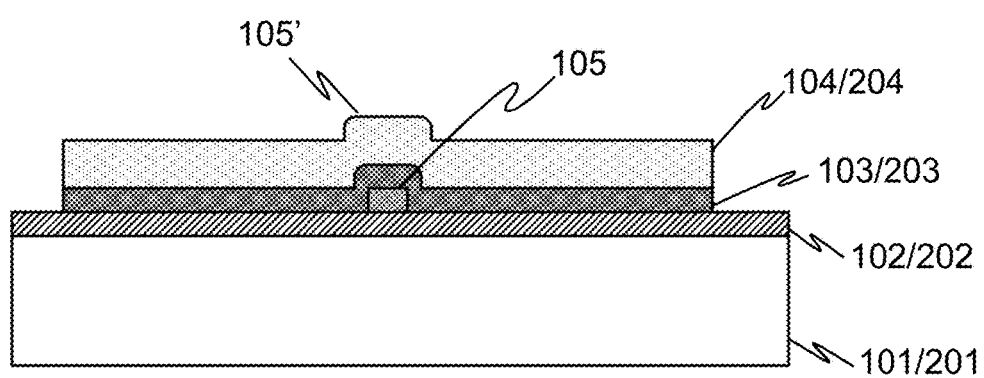
FIG. 1b schematically shows a first substrate comprising a bond force concentrator according to certain example embodiments.

FIG. 1b shows the first substrate 101 or the second substrate 201 comprising an alternative rectangular bond force concentrator 105 according to certain example embodiments. In certain embodiments, the first substrate 101 or the second substrate 201 is a silicon substrate and the first substrate 101 or the second substrate 201 comprises an insulation layer 102/202. In certain alternative embodiments, the rectangular bond force concentrator 105 is below the adhesion layer 103/203 and/or the bond layer 104/204 (but on top of the insulation layer 102/202). In these embodiments, the rectangular bond force concentrator 105 creates (generates, forms, causes) an essentially rectangular shape 105' to the layer(s) 103/203, 104/204 above. In certain embodiments, the shape 105' comprises rounded corners (due to shape transfer through additional layer(s) deposited). As shown in FIG. 1b, in certain embodiments, the (shape of) rectangular bond force concentrator 105 is copied to the layer(s) above (resulting in the shape 105'). In certain embodiments, the shape 105' receives the opposing substrate upon bonding.

Figure 2:
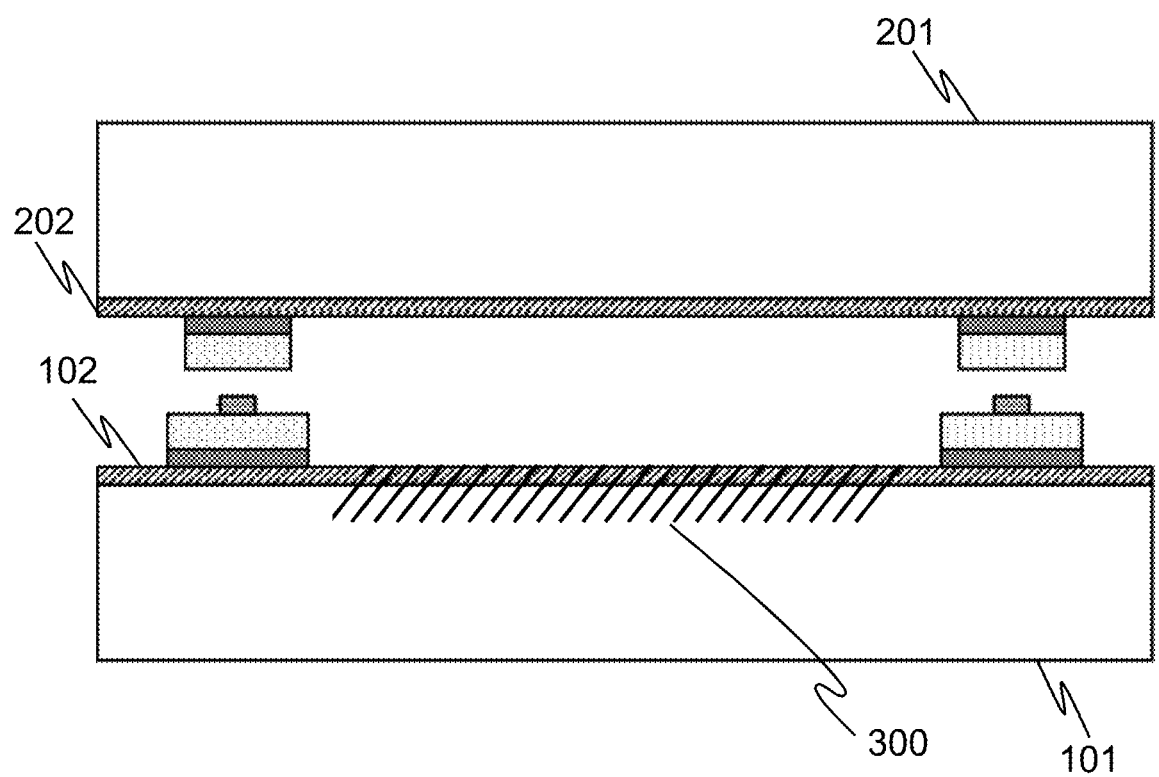
FIG. 2 schematically shows a first substrate comprising a device according to certain example embodiments.

FIG. 2 shows a first substrate 101 comprising a device 300 according to certain example embodiments. In certain embodiments, the first substrate 101 or the second substrate 201 comprises a device. In certain embodiments, both first 101 and the second substrate 201 comprise devices. The slashed area of FIG. 2 illustrates the location of the device 300 at the substrate. In certain embodiments, device 300 is partially at the insulation layer 102.

In certain embodiments, the device 300 is a semiconductor device. In certain embodiments, the device 300 is a resonator. In certain embodiments, the device 300 is a microelectromechanical systems, MEMS, resonator. In certain embodiments, the resonator is a stacked beam resonator. As used herein, the stacked beam resonator comprises a plurality of resonator beam elements positioned side-by-side in a plane, separated by trenches and connected by connection elements. In certain embodiments, the device 300 is adapted to resonate in an in-plane length extensional resonance mode.

In certain embodiments, the rectangular bond force concentrator 105 is fabricated after fabricating said device 300. In certain embodiments, fabricating (providing) the rectangular bond force concentrator 105 last step prior to the bonding.

Figure 3A:
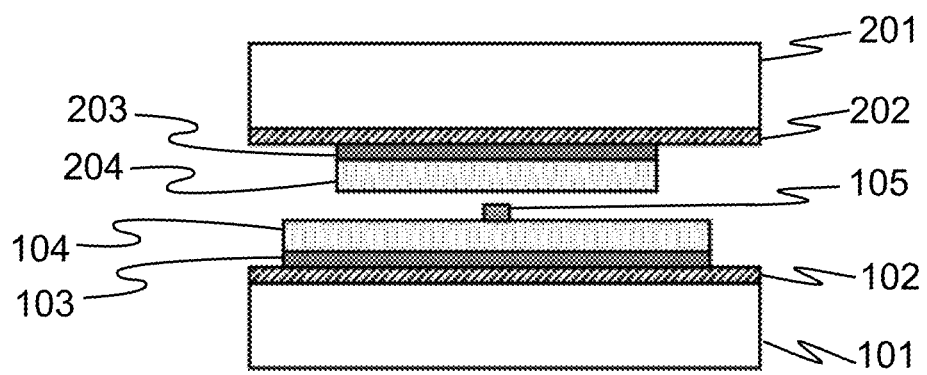
FIG. 3a-d schematically show forming of a bond using the rectangular bond force concentrator according to certain example embodiments.

FIG. 3a-d show forming of a bond using the rectangular bond force concentrator 105 according to certain example embodiments. FIG. 3a shows the first substrate 101 and the second substrate 201. In certain embodiments, the first substrate 101 and/or the second substrate 201 comprise an insulation layer 102, 202, respectively. As shown in FIGS. 3a-d, the first substrate 101 comprises a rectangular bond force concentrator 105. In certain embodiments, the first substrate 101 further comprises an adhesion layer 103 and/or a bond layer 104. In certain embodiments, the second substrate 201 further comprises an adhesion layer 203 and/or a bond layer 204.

Figure 3B:
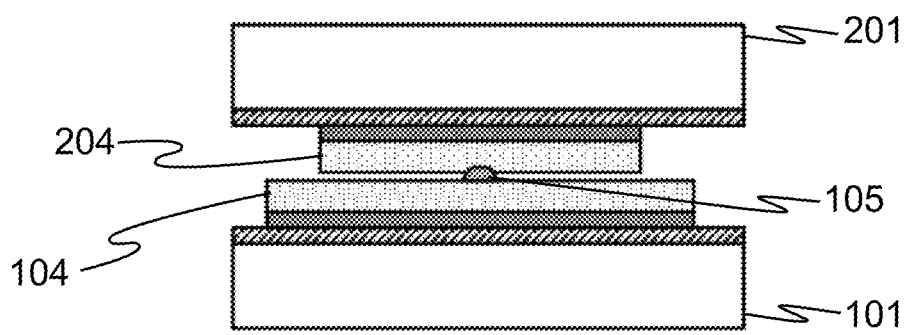

As shown FIGS. 3a-b, the first substrate 101 and the second substrate 201 are bonded together to form a bond. In certain embodiments, the bonding comprises thermocompression bonding.

In certain embodiments, the rectangular bond force concentrator 105 is a raised feature that concentrates the force used in the bonding to a very small area resulting in a very high pressure at the bonding area under the rectangular bond force concentrator feature. The usage of the rectangular bond force concentrator enables utilizing smaller total pressure during said bonding. In certain embodiments, said bonding comprises (essentially) two stages and said stages comprise different level of pressure provided. In certain embodiments, said bonding comprises a first stage, in which high pressure is provided via the bond force concentrator, and a second stage, in which said bonding is finished via low pressure.

Figure 3C:
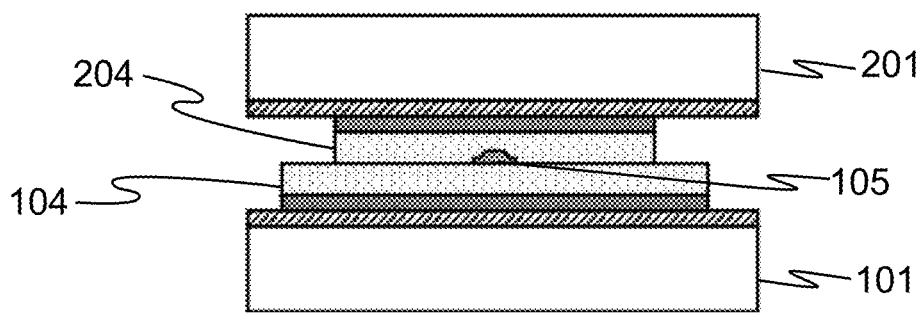

In certain embodiments, the rectangular bond force concentrator 105 is brought to contact with the second substrate 101 to form the bond, as shown in FIG. 3a. In certain embodiments, the rectangular bond force concentrator 105 receives the second substrate 105 in said bonding, as shown in FIG. 3b. In certain embodiments, the rectangular bond force concentrator 105 penetrates (protrudes, diffuses, merges) into the bond layer 204 of the second substrate 201 as shown in FIG. 3c.

Figure 3D:
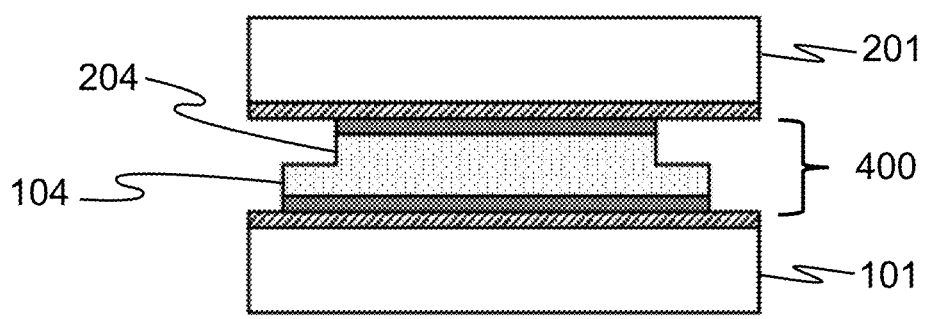

In certain embodiments, said bonding comprises deforming the rectangular bond force concentrator 105 to form the bond. As shown in FIG. 3d, the rectangular bond force concentrator 105 loses its original rectangular shape during said bonding and merges with (into) the bond layers 104 and 204.

As mentioned, the bond force concentrator 105 enables concentrating the force in the beginning of the bonding to a very small area resulting in a very high pressure at the bonding area. Once the rectangular bond force concentrator 105 deforms and merges with the adjacent material layers, the bonding pressure decreases due to the increased contact surface area. The bonding is finished at a lower level of pressure. The decrease of the pressure at the later stage of the bonding enables alleviating the risk of harmful residual stress in the bonded chip and even the risk of breaking the substrate.

According to the present disclosure there is provided an apparatus comprising a first substrate 101 and a second substrate 201 bonded together using a rectangular bond force concentrator 105 to form a bond, wherein the first substrate 101 or the second substrate 201 comprises the rectangular bond force concentrator 105 and/or a device 300. FIG. 3d shows the bond 400 of the apparatus. In certain embodiments, said bond 400 is formed by causing the rectangular bond force concentrator 105 to penetrate into the material layer(s) of the opposite substrate. In certain embodiments, the said bond 400 is formed by causing the rectangular bond force concentrator 105 to lose its original rectangular shape during said bonding and to merge with the bond layer(s) 104, 204.

According to the present disclosure of the invention there is provided a use of a bond force concentrator 105 in bonding a first substrate 101 and a second substrate 201 to form a bond 400, as shown in the example embodiments of FIGS. 3a-3d.

Without limiting the scope and the interpretation of the patent claims, certain technical effects of one or more of the example embodiments disclosed herein are listed in the following. The instant invention provides benefits in comparison to the conventional bonding features (such as those features in which the bonding feature is a round-shaped silicon bump underneath all the other material layers and structures fabricated for the device, such as ones made using local oxidation of silicon, LOCOS).

A technical effect of the invention is enabling concentration of the force in the beginning of the bonding to a very small area resulting in a very high pressure at that area (bonding area). This enhances the bonding (enhances the process of forming a bond). The rectangular shape of the bond force concentrator is especially beneficial in this aspect. Once the rectangular bond force concentrator deforms and merges (diffuses) with the adjacent material layers, the pressure of the bonding decreases. The force applied to the wafers can be kept constant and as the bond force concentrator deforms and contact area increases, the bonding pressure decreases as a result of the increasing contact area. The decrease of the pressure at the later stages of the bonding enables alleviating the risk of harmful residual stress in the bonded apparatus.

A further technical effect is that the rectangular bond force concentrator enables easier, cheaper, and less complex fabrication than the conventional features. Namely, the fabrication of the rectangular bond force concentrator requires no etching of other layers, e.g., insulation layer. Also, due to the ingenious rectangular bond force concentrator, the material layers needed are thinner than in the conventional bonding features, resulting in less material costs. The rectangular shape of the bond force concentrator is especially beneficial in this aspect.

Furthermore, since the bond force concentrator is fabricated after the device according to certain embodiments of the present disclosure, it makes the manufacturing of all the other features, such as the fabrication of the device, on the substrate significantly easier. If the bonding feature were fabricated first onto the substrate (which is the conventional way), all the following processes of manufacturing the device would have to be adjusted according to the bonding feature already on the substrate.

A further technical effect is enabling alleviating the surface smoothness requirements of bonding and allowing to bond rougher surfaces together. A further technical effect is enabling wafer-level packaging (WLP) and hermetical sealing.

Furthermore, the method according to the first aspect, the chip according to the second aspect and the use according to the third aspect are easy to integrate into existing processes.

Various embodiments have been presented. It should be appreciated that in this document, words comprise, include, and contain are each used as open-ended expressions with no intended exclusivity.

The foregoing description has provided by way of non-limiting examples of particular implementations and embodiments a full and informative description of the best mode presently contemplated by the inventors for carrying out the invention. It is however clear to a person skilled in the art that the invention is not restricted to details of the embodiments presented in the foregoing, but that it can be implemented in other embodiments using equivalent means or in different combinations of embodiments without deviating from the characteristics of the invention.

Furthermore, some of the features of the afore-disclosed example embodiments may be used to advantage without the corresponding use of other features. As such, the foregoing description shall be considered as merely illustrative of the principles of the present invention, and not in limitation thereof. Hence, the scope of the invention is only restricted by the appended patent claims.

The invention claimed is:

1. A method for bonding a first substrate with a second substrate, comprising the steps of:
providing a first substrate and a second substrate;
bonding the first substrate and the second substrate together using a rectangular bond force concentrator to form a bond, wherein the first substrate or the second substrate comprises a device; and
finishing the fabricating of said rectangular bond force concentrator before finishing of fabricating said device.

2. The method of claim 1, wherein the first substrate comprises a bond layer, and the second substrate comprises another bond layer, wherein the first substrate or second substrate comprises the rectangular bond force concentrator on the bond layer.

3. The method of claim 2, wherein the rectangular bond force concentrator merges with the bond layers of the first substrate and the second substrate during said bonding to form the bond.

4. The method of claim 1, comprising fabricating a rectangular bond force concentrator onto the first substrate or the second substrate.

5. The method of claim 1, comprising providing the rectangular bond force concentrator from different material than the first substrate and the second substrate.

6. The method of claim 4, comprising fabricating the rectangular bond force concentrator by evaporation.

7. The method of claim 1, comprising fabricating an adhesion layer and/or a bond layer below the rectangular bond force concentrator.

8. The method of claim 1, wherein the device is a microelectromechanical systems, MEMS, device.

9. The method of claim 1, wherein said bonding comprises thermocompression bonding.

10. The method of claim 1, wherein the rectangular bond force concentrator is a topmost raised feature on the top of the layer(s) of the first substrate or the second substrate.

11. The method of claim 1, wherein the rectangular bond force concentrator is brought to contact with another substrate to form the bond.

12. The method of claim 1, wherein said bonding comprises deforming the rectangular bond force concentrator to form the bond.

13. An apparatus obtained via the method according to claim 1, comprising a first substrate and a second substrate bonded together using a rectangular bond force concentrator to form a bond, wherein the first substrate or the second substrate comprises the rectangular bond force concentrator and/or a device.

14. The apparatus of claim 13, wherein the first substrate comprises a bond layer, and the second substrate comprises another bond layer, wherein the first substrate or second substrate comprises the rectangular bond force concentrator on the bond layer.

15. The apparatus of claim 14, wherein the rectangular bond force concentrator merges with the bond layers of the first substrate and the second substrate during said bonding to form the bond.

16. The apparatus of claim 13, comprising the rectangular bond force concentrator penetrated into the opposing layer(s) of the first substrate or the second substrate.

17. A method for bonding a first substrate with a second substrate, comprising the steps of:
   providing a first substrate and a second substrate; and
   bonding the first substrate and the second substrate together using a rectangular bond force concentrator to form a bond, wherein the first substrate or the second substrate comprises a device,
   wherein said bonding comprises a first stage, in which high pressure is provided via the bond force concentrator, and a second stage, in which said bonding is completed via low pressure.

18. The method of claim 17, wherein the first substrate comprises a bond layer, and the second substrate comprises another bond layer, wherein the first substrate or second substrate comprises the rectangular bond force concentrator on the bond layer.

19. The method of claim 18, wherein the rectangular bond force concentrator merges with the bond layers of the first substrate and the second substrate during said bonding to form the bond.

20. The method of claim 17, comprising fabricating a rectangular bond force concentrator onto the first substrate or the second substrate.

* * * * *